United States Patent [19]
Perry et al.

[11] Patent Number: 5,907,436
[45] Date of Patent: May 25, 1999

[54] MULTILAYER DIELECTRIC DIFFRACTION GRATINGS

[75] Inventors: Michael D. Perry, Livermore; Jerald A. Britten, Oakley; Hoang T. Nguyen, Livermore; Robert Boyd, Livermore; Bruce W. Shore, Livermore, all of Calif.

[73] Assignee: The Regents of the University of California, Oakland, Calif.

[21] Appl. No.: 08/536,874

[22] Filed: Sep. 29, 1995

[51] Int. Cl.[6] .................... G02B 5/18; G02B 1/10; G03F 9/00
[52] U.S. Cl. ............... 359/576; 359/569; 359/572; 359/571; 359/587; 430/5
[58] Field of Search ................... 359/566, 568, 359/571, 572, 573, 574, 575, 576, 584, 587; 437/187; 430/5; 156/345

[56] References Cited

U.S. PATENT DOCUMENTS

| | | | |
|---|---|---|---|
| 4,068,260 | 1/1978 | Ohneda et al. | 359/572 |
| 4,155,627 | 5/1979 | Gale et al. | 359/568 |
| 4,281,894 | 8/1981 | Guha | 350/162 |
| 4,313,648 | 2/1982 | Yano et al. | 359/587 |
| 4,330,175 | 5/1982 | Fujii et al. | 359/571 |
| 4,482,207 | 11/1984 | Thomas | 359/576 |
| 4,828,356 | 5/1989 | Hobrock et al. | 359/572 |
| 5,009,484 | 4/1991 | Gerritsen | 350/162.11 |
| 5,219,788 | 6/1993 | Abernathey et al. | 437/187 |
| 5,254,202 | 10/1993 | Kaplan | 156/345 |

OTHER PUBLICATIONS

J. M. Elson, Infrared light scattering surfaces covered with multiple dielectric overlays, Dec. 18, 1975, Applied Optics, vol. 16, No. 11, Nov. 1977, pp. 2872–2881.

*Primary Examiner*—Cassandra Spyrou
*Assistant Examiner*—Audrey Chang
*Attorney, Agent, or Firm*—John P. Wooldridge

[57] ABSTRACT

The design and fabrication of dielectric grating structures with high diffraction efficiency used in reflection or transmission is described. By forming a multilayer structure of alternating index dielectric materials and placing a grating structure on top of the multilayer, a diffraction grating of adjustable efficiency, and variable optical bandwidth can be obtained. Diffraction efficiency into the first order in reflection varying between 1 and 98 percent has been achieved by controlling the design of the multilayer and the depth, shape, and material comprising the grooves of the grating structure. Methods for fabricating these gratings without the use of ion etching techniques are described.

19 Claims, 8 Drawing Sheets

EXPOSE PHOTORESIST TO GRATING PATTERN

FIG. 9E ured by an equivalent transverse magnetic
MULTILAYER DIELECTRIC DIFFRACTION GRATINGS The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to diffraction gratings, and more specifically, it relates to grating designs using dielectric materials rather than metallic surfaces.

2. Description of Related and Prior Art

Diffraction gratings produced by mechanical ruling into metals have been available since the early 1900's. High groove density (up to 1800 lines/mm) gratings are also produced in dielectric materials (e.g., glass) by mechanical ruling. These gratings can produce high diffraction efficiency by overcoating with thin metallic films. Mechanically ruled gratings of high groove density (>1200 lines/mm) are difficult to produce in sizes larger than approximately 20 cm×30 cm due to wear of the cutting edge and typically exhibit a high degree of scattered radiation.

The development of high coherence length lasers and photoresistive materials in the 1970's made possible a holographic technique for the production of gratings. Holographic gratings are produced by interfering two highly coherent laser beams in a photosensitive material. A standing wave pattern with a periodic, sinusoidal distribution of intensity is produced in the material. Subsequent development in photoresistive materials produces a periodic surface relief pattern related to the original interference pattern of laser light on the surface. This pattern can be etched into the substrate material by wet chemical, plasma and/or ion bombardment techniques (either sputtering or reactive ion etching) to produce an original master grating. The pattern from the master grating can be printed to produce secondary or "replica" gratings using numerous replication techniques.

Figure 2:
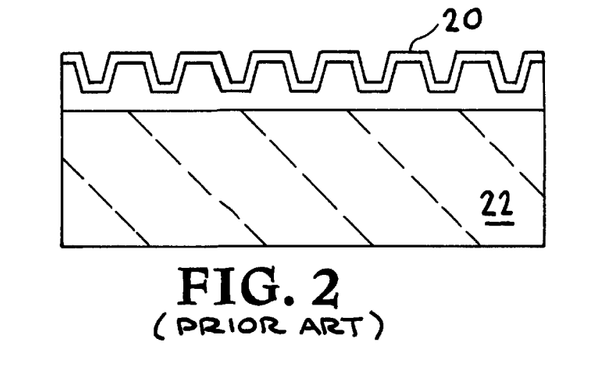
FIG. 2 shows a prior art high efficiency metallic grating.

Whether left in the photosensitive material, transfer etched into the substrate and/or replicated, high diffraction efficiency in reflection is achieved by coating the surface relief pattern with a thin metallic film similar to that applied to increase the efficiency of ruled gratings. FIG. 2 shows a prior art high efficiency metallic grating 20 on a substrate 22. Diffraction efficiency as high as 95% has been obtained with metallic gratings produced by both ruling and holographic techniques. Metallic gratings exhibit a broad-bandwidth determined by the shape and depth of the groove profile and the reflectivity of the metal (gold is typically used in the infrared region of the spectrum, silver or aluminum in the visible). Due to the inherently broad-band nature of the reflectivity of metals, frequency selectivity is accomplished only by the dispersion of the grating structure. High resolution and/or high discrimination is achieved by the use of several gratings in series. Metallic gratings cannot be used to simultaneously transmit broadband radiation in the 200 nm to 3000 nm range while diffracting select frequencies.

Finally, metallic diffraction gratings whether produced by mechanical ruling or holographic techniques, have an inherently low threshold for optical damage. State of the art commercial gratings exhibit a damage threshold of less than 600 millijoules/cm$^2$ for nanosecond laser radiation in the infrared, with lower damage thresholds at shorter wavelengths. The damage threshold for metallic gratings is determined by absorption of the incident radiation, heat transfer within the metal and the finite thickness of the metal films overcoating the surface relief profile. The damage threshold is increased for metallic gratings by decreasing the absorption and is therefore dependent upon the incident polarization of the light and its wavelength. Metal gratings exhibit decreased absorption for light which has a transverse electric (TE) polarization where the incident electric field is polarized parallel to the grooves. However, high efficiency TE metallic gratings are difficult to fabricate since the grooves must be much deeper than an equivalent transverse magnetic grating.

The limitations of metallic gratings are fundamentally related to the optical, mechanical and thermal properties of the metal itself. Many of these limitations (low optical damage threshold, low degree of frequency selectivity, finite absorption) are shared by conventional metallic mirrors. To overcome these limitations for mirrors and beam splitters, multilayer dielectric coatings were introduced. The reflectivity of a multilayer dielectric coated material is determined by thin film interference effects within the multilayer structure. Mirror coatings with reflectivity ranging from as low as 0.1% to as high as 99.9% are readily available in the visible range of the spectrum and extending to the near infrared and ultraviolet. These coatings consist of a range of materials including fluorides, oxides, sulfides, etc. By proper selection of materials and design of the optical thickness of the layers, multilayer mirrors with controllable bandwidth and negligible absorption are now commonly produced. These multilayer dielectric mirrors overcome many of the limitations of metallic mirrors described earlier.

Prior and related art associated with dielectric gratings is described in by J. M. Elson, "Infrared light scattering from surfaces coated with multiple dielectric overlayers", Applied Optics, vol 16, pp. 2872–2881 (1977) and U.S. Pat. Nos. 4,281,894 (8/1981 by Guha), 4,828,356 (5/1989 by Hobrock, et al) and 5,009,484 (4/1991 by Gerritsen).

Figure 3:
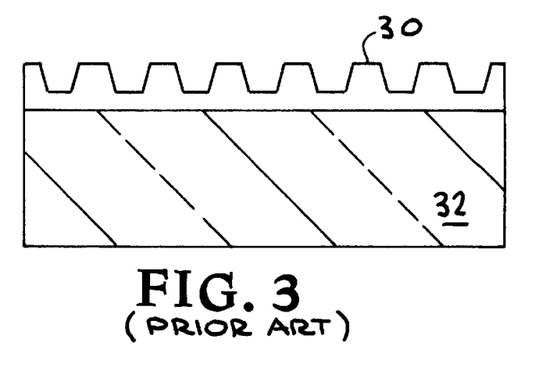
FIG. 3 shows a prior art low efficiency grating on transparent substrate.
Figure 4:
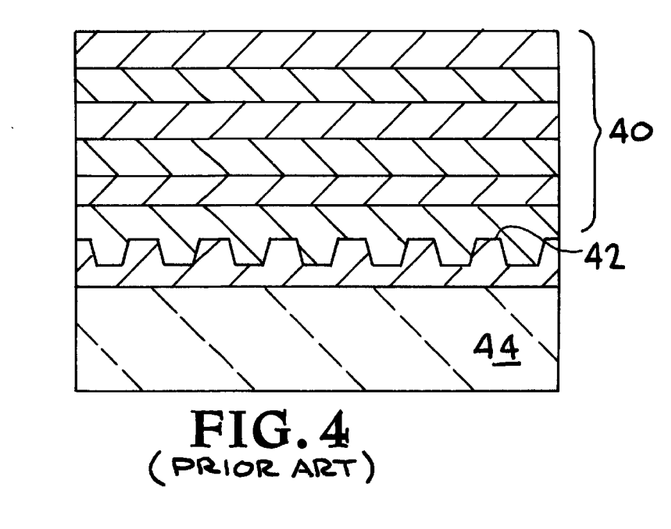
FIG. 4 shows a prior art low efficiency (<0.1%) multilayer dielectric grating concept where a multilayer stack is applied over a surface relief profile.

With the exception of U.S. Pat. No. 5,009,484, the prior art is concerned with the problem of forming extremely low efficiency diffraction gratings (<0.1%) to serve as beam samplers for high power lasers. Dielectric overcoatings of either metal or dielectric grating structures as shown in FIGS. 3 and 4 (prior art) can be used as low efficiency gratings but do not function as high efficiency or frequency selective gratings. FIG. 3 shows a prior art low efficiency grating 30 on transparent substrate 32.

Figure 5:
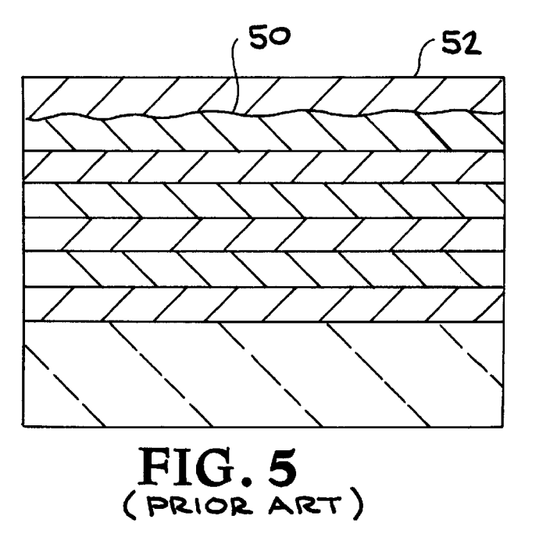
FIG. 5 shows a prior art low efficiency (<0.1%) multilayer grating where a shallow surface relief profile is produced in the second layer (from the top) and then overcoated with one or more layers.

FIG. 4 shows a prior art low efficiency (<0.1%) multilayer dielectric grating concept where a multilayer stack 40 is applied over a surface relief profile 42 on a substrate 44. FIG. 5 shows a prior art low efficiency (<0.1%) multilayer grating where a shallow surface relief profile 50 is produced in the second layer (from the top 52) and then overcoated with one or more layers.

U.S. Pat. Nos. 4,281,894 and 4,828,356 describe methods of fabricating grating structures in either the top of the dielectric multilayer (U.S. Pat. No. 4,828,356) or near the top (U.S. Pat. No. 4,281,894) to produce very low diffraction efficiency (<10$^{-4}$) for beam sampling purposes. Both patents are concerned with the formation of extremely shallow grooves and the choice of Zinc Sulfide or Zinc Selenide as an optimized material. The required deep groove structure of high efficiency gratings (1–99%) relative to low efficiency sampling gratings (10$^{-4}$) distinguishes their design and fabrication from the relatively simple fabrication of low efficiency sampling gratings.

The objective of U.S. Pat. No. 4,828,356 was to produce low efficiency surface relief gratings with a square groove shape into dielectric materials overcoating metal reflectors or multilayer structures deposited on a reflecting substrate. By using anisotropic ion etching techniques on holographically exposed substrates, shallow (~10 nm) grooves of controllable depth could be produced over very large areas (>1 m$^2$) resulting in uniform diffraction efficiency. By trimming the thickness of the top layer of the coating/grating combination, the efficiency of the grating could be tuned to the desired value. This patented method has been used to fabricate low to moderate efficiency gratings in multilayer coatings consisting of zinc sulfide (ZnS), thorium fluoride (ThF$_4$), or zinc selenide (ZnSe) overcoating a metallic reflector.

U.S. Pat. No. 5,009,484 describes gratings formed on one side of thin glass substrates (windows). The grating structure is designed to diffract broadband visible radiation (sunlight) with moderately high efficiency. The gratings function in transmission only with the purpose of diffracting daylight for improved lighting in buildings. The gratings do not employ the use of any multilayer structures. They are based simply on deep grooves aligned at an appropriate angle for incident broadband radiation.

SUMMARY OF THE INVENTION

It is an object of the present invention to provide dielectric grating structures with high diffraction efficiency used in reflection or transmission.

It is also an object of the present invention to provide methods of making dielectric grating structures with high diffraction efficiency used in reflection or transmission.

By forming a multilayer structure of alternating index dielectric materials and placing a grating structure on top of the multilayer structure, a diffraction grating of adjustable efficiency, and variable optical bandwidth can be obtained. Diffraction efficiency into the first order in reflection varying between 0.1 and 98 percent has been achieved by controlling the design of the multilayer and the depth, shape, and material comprising the grooves of the grating structure. Any dielectric material which exhibits low absorption at the wavelength of interest can be used to comprise the dielectric layers. By using oxides (e.g., HfO$_2$, SiO$_2$, Ta$_2$O$_{4-5}$, ZrO$_2$, TiO$_2$, Sc$_2$O$_3$, etc.) to comprise the multilayer structure, the gratings can be fabricated to exhibit a high threshold for damage by intense optical radiation, making them suitable for use with high power lasers in the range 300 to over 1500 nm. At longer wavelengths, the use of sulfides (e.g., ZnS), selenides (e.g., ZnSe) or fluorides (e.g., ThF$_4$) offer negligible absorption and hence high damage threshold. For very short wavelength use, low index fluorides such as MgF$_2$, CaF$_2$, LiF, can be used in conjunction with higher index oxides or higher index fluorides (e.g., ThF$_4$) to comprise the multilayer. An important feature of the invention is that high diffraction efficiency can be achieved in reflection without the need for metallic coatings either overcoating the grating structure or underneath the dielectric stack.

The multilayer dielectric gratings of the present invention are formed by deposition of the grating on top of the multilayer without ion etching techniques (e.g., deposition through a mask, preparation directly in photosensitive material deposited on the multilayer, or deposition of a dielectric material on top of a mask followed by removal of the mask by chemical, plasma or mechanical means). These techniques are illustrated in FIGS. 7–9. For most applications, these techniques are much simpler and less expensive than fabrication techniques which employ an ion etching step.

These gratings were initially developed for the compression and stretching of broadband laser pulses. They were designed to solve the need for high efficiency gratings used in reflection or transmission which could withstand the optical intensity present with high power laser systems. They are an enabling technology for the compression of high energy (>3 Joule) pulses on short pulse (<10 nanosecond) lasers. However, their bandwidth selectivity, ability to control the amplitude of the light scattered into different orders and high damage threshold extends the use of these gratings to applications far beyond the pulse compression use for which they were initially conceived.

DETAILED DESCRIPTION OF THE INVENTION

The invention is a new type of variable efficiency diffraction grating formed from purely dielectric materials. The grating can achieve high diffraction efficiency in reflection or transmission over an adjustable bandwidth and angle of use and can be manufactured to exhibit substantially increased resistance to optical damage over prior art metallic gratings. In general, a multilayer oxide stack is placed on a substrate which in general may be composed of transparent or opaque material of any geometry (e.g., flat or curved). The dielectric stack will normally consist of alternating layers of high and low index dielectric materials (e.g., HfO$_2$, SiO$_2$, Ta$_2$O$_{4-5}$, Sc$_2$O$_3$, ZrO$_2$, TiO$_2$, Al$_2$O$_3$, MgF$_2$, CaF$_2$, ThF$_4$, ZnS, ZnSe, etc.) which exhibit low absorption at the wavelength of use.

Figure 1A:
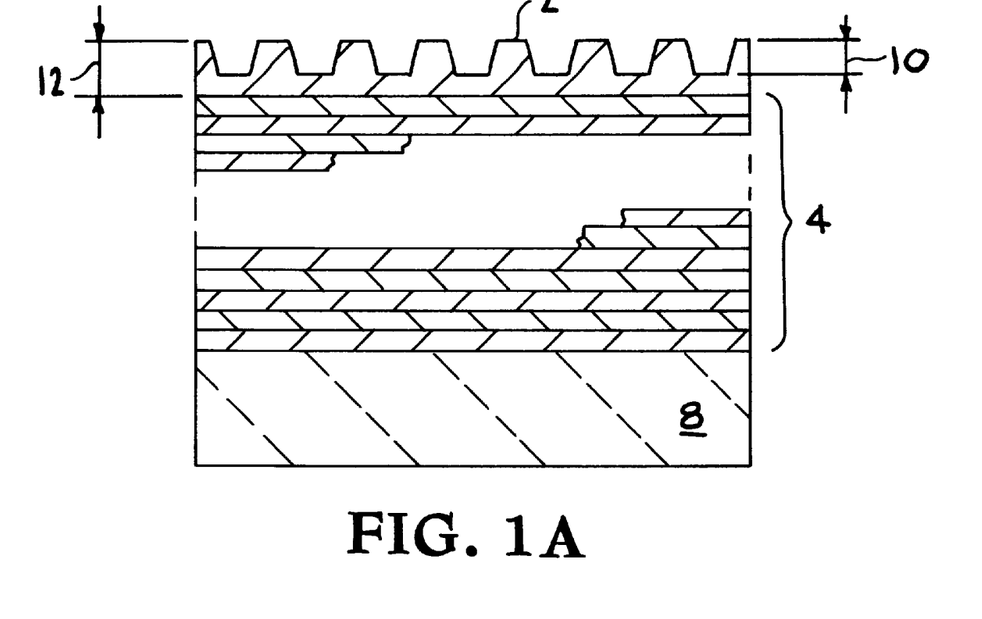
FIG. 1A illustrates the multilayer dielectric grating concept.
Figure 1B:
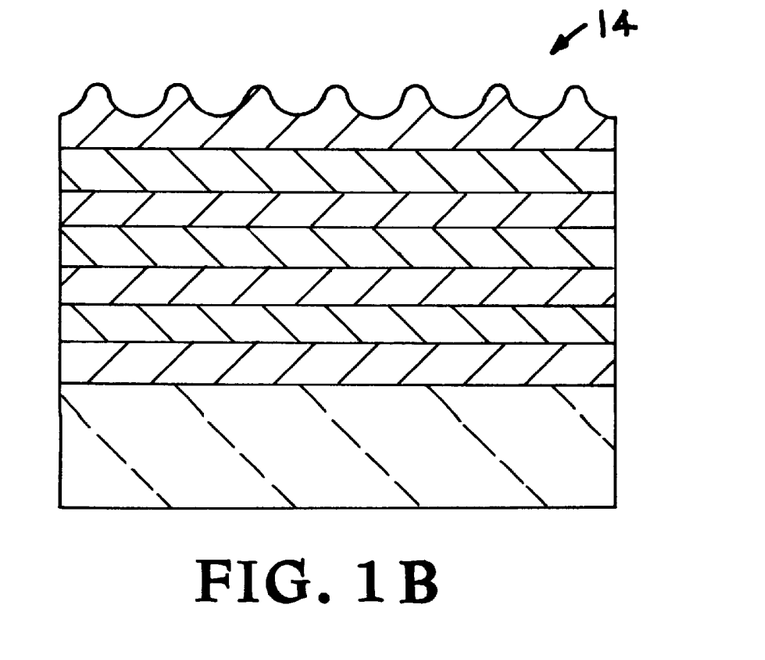
FIG. 1B shows a multilayer dielectric grating with deep (~300 nm) grooves which exhibits over 97% diffraction efficiency at 1053 nm.

As shown in FIG. 1A, grating 2 is affixed onto the top layer of layer of the dielectric stack 4. The multilayer structure 4 must be designed for use with the grating layer 2 under consideration since the grating layer 2 will comprise one of the layers of the multilayer stack 4. The multilayer stack 4 is affixed to a substrate 8. FIG. 1A shows groove height 10 and top layer thickness 12. FIG. 1B shows a multilayer dielectric grating 14 with deep (~300) grooves which exhibits over 97% diffraction efficiency at 1053 nm.

Figure 6:
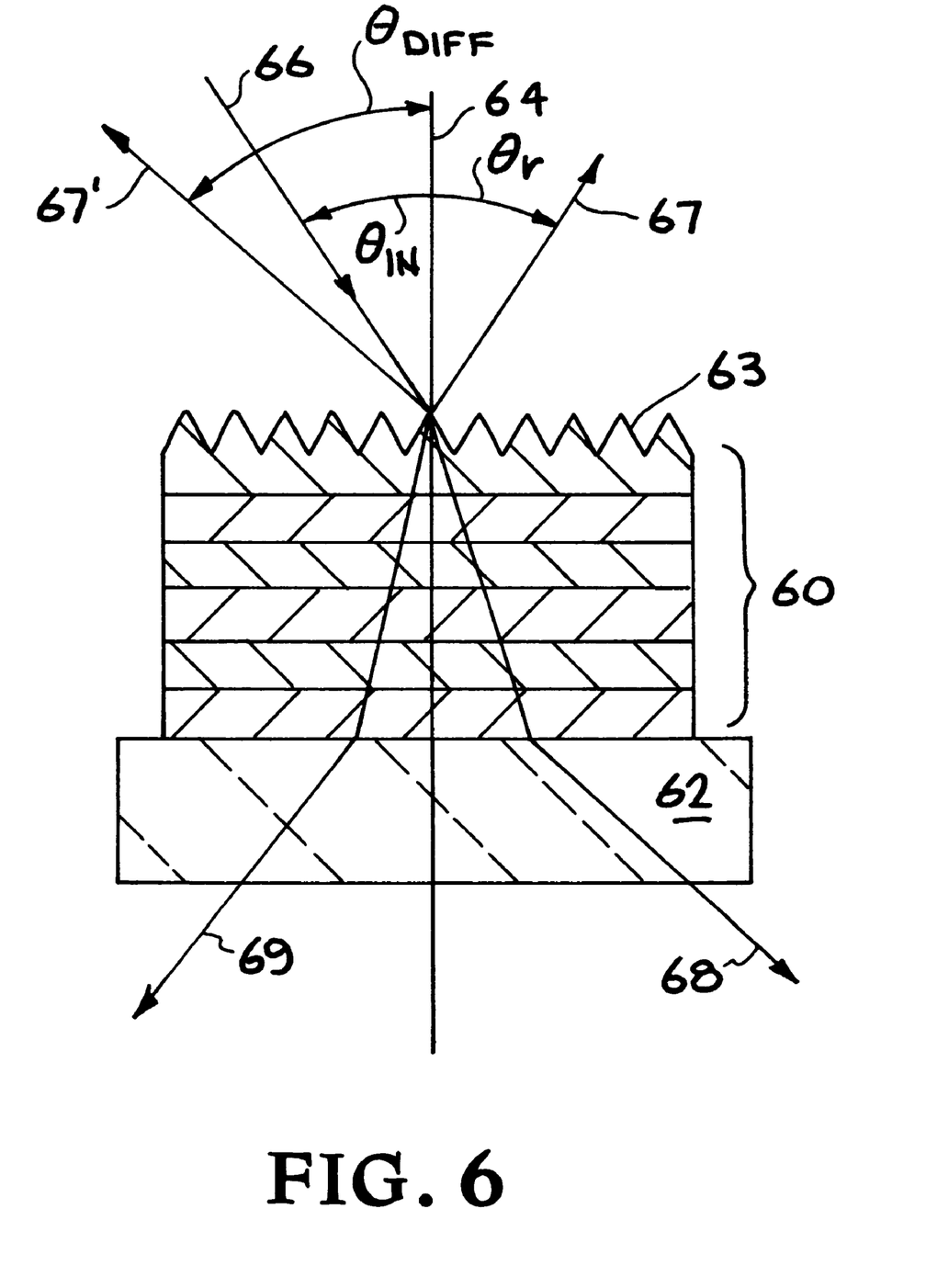
FIG. 6 shows the operation of a variable efficiency multilayer dielectric grating.

FIG. 6 shows the operation of a multilayer dielectric grating of the present invention having a multilayer section

60, a substrate 62, and a surface normal 64 to the multilayer section 62 and the grating layer 63 of multilayer section 60. The grating can be designed to distribute the amount of radiation in the reflected, transmitted and diffracted beams as desired. In the figure, incident beam 66, having an angle θin with respect to the normal 64, is incident upon the grating layer 63. Incident beam 66 is divided into several beams including a reflected beam 67 ($\theta_r$) at m=0. a reflected diffracted beam 67' at m=±0, a transmitted beam 68 at m=0 and a transmitted diffracted beam 69 ($\theta_{diff}$) at m=±1.

By adjusting the design of the dielectric multilayer coating and/or the grating layer, the distribution of energy between the reflected, transmitted and diffracted beams can be arbitrarily controlled. Specifically, the grating will diffract light at an angle, $\theta_{diff}$, given by the equation, $m\lambda=d(\sin\theta_i \pm \sin\theta_{diff})$, where m is the diffracted order, λ is the desired wavelength, d is the spacing between the grooves, θi and $\theta_{diff}$ are in the angles of incidence and diffraction, respectively. The multilayer and grating are designed to reflect, transmit, and diffract light of wavelength, λ, into the angles: $\theta_r=\theta_i$ for the specularly reflected beam (m=0), and $\theta_{diff}$ for the diffracted beam.

These gratings can be fabricated by controlled deposition techniques or directly in photosensitive material as shown in FIGS. 7–9. The multilayer stack is designed for use with the top grating layer. The multilayer dielectric is then produced on top of a substrate which may be either reflecting, transparent, or opaque to the wavelength of interest. The initial multilayer dielectric stack is formed by any conventional coating method including but not limited to: electron beam evaporation, chemical vapor deposition, and molecular beam epitaxy.

Figure 7A:
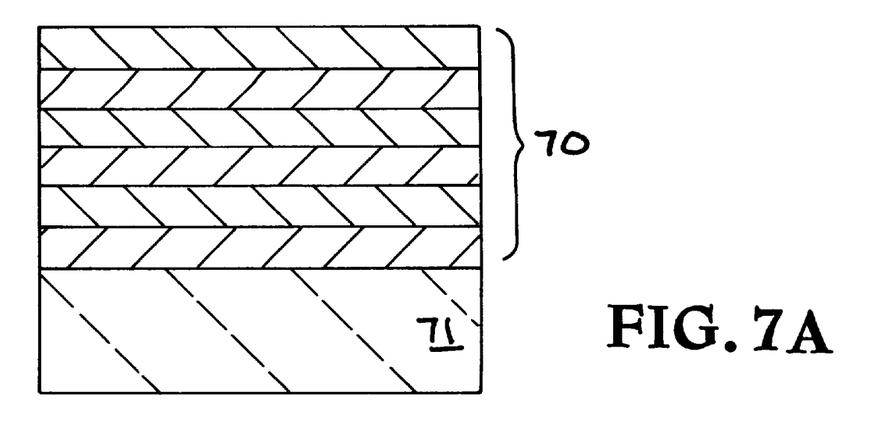
FIGS. 7A–E show the steps for fabricating a multilayer dielectric grating with deposition of the top dielectric (groove) layer through a free standing mask.
Figure 7B:
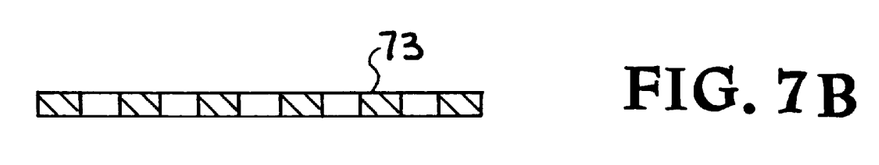
Figure 7C:
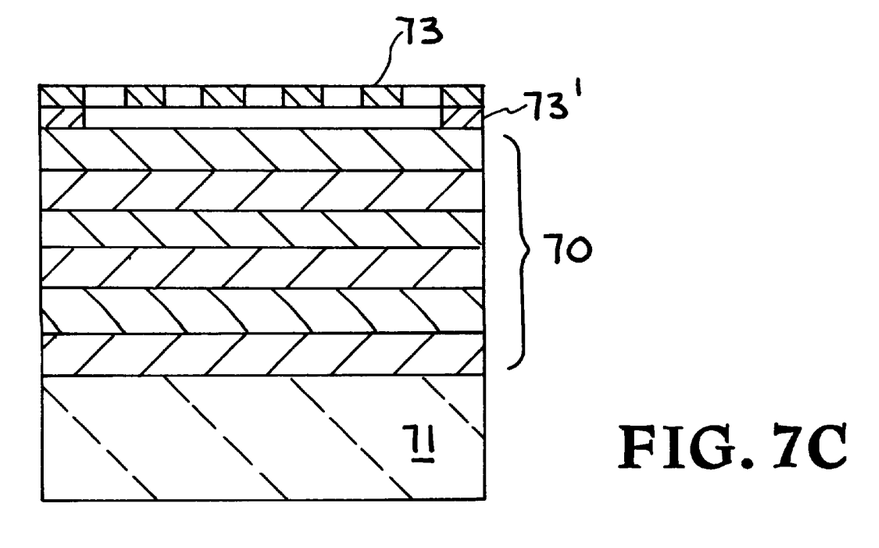
Figure 7D:
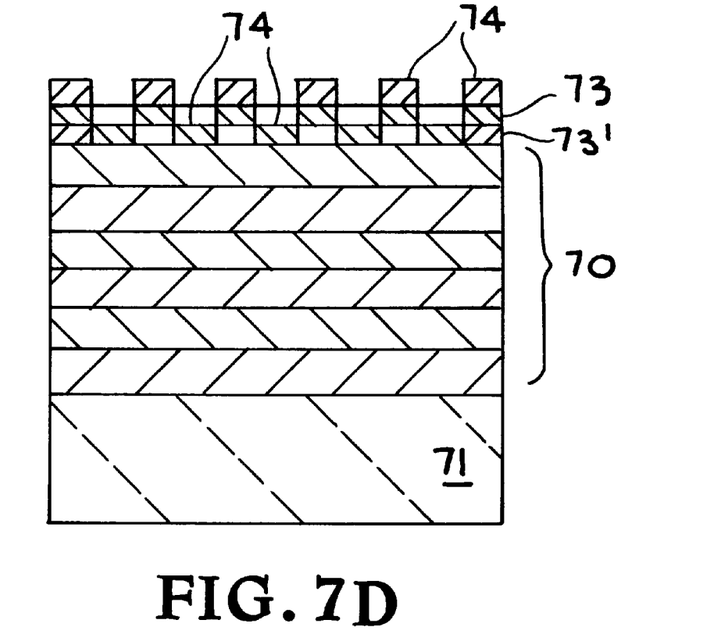
Figure 7E:
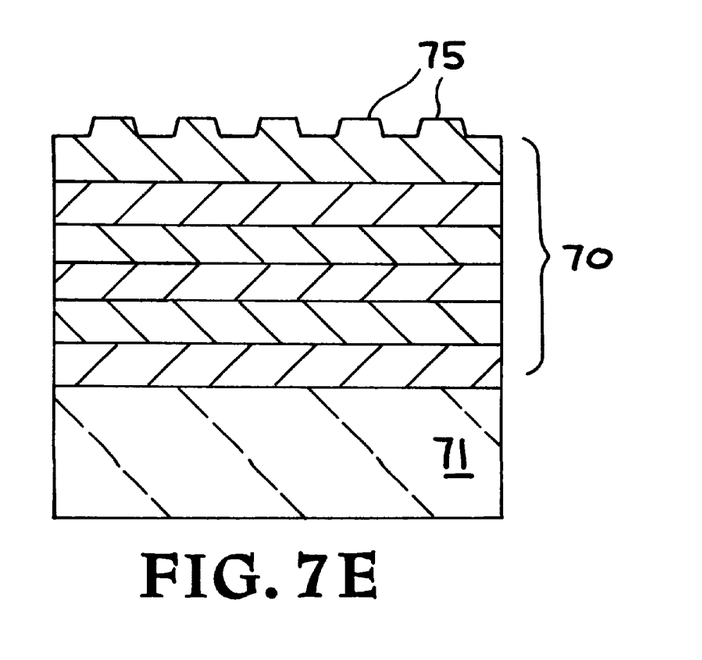

In the direct deposition process shown in FIGS. 7A–7E, a multilayer dielectric coating 70 is affixed to a substrate 71 (FIG. 7A). A free standing deposition mask 73 is produced (FIG. 7B) and placed above the multilayer dielectric stack 70 (FIG. 7C) using spacers 73'. The mask 73 consists of periodic open and closed regions (lines) and may be made from any conventional means including but not limited to: e-beam lithography, x-ray, ultraviolet lithography, visible lithography, anisotropic etching of crystals, ion milling or conventional mechanical cutting. The grating is then formed by directional evaporation of the dielectric grating material 74 through the mask 73 (FIG. 7D). The open regions of the mask allow dielectric material to flow through the mask 73 and deposit on top of the multilayer stack 70. The closed regions of the mask block the deposition. The mask 73 is then removed by chemical, plasma or physical means (FIG. 7E) leaving a completed grating 75. Removal of the mask also removes the dielectric material which deposited on top of the closed regions of the mask. The result is a multilayer dielectric grating where the groove structure is in the top layer.

A second technique which is particularly useful for non-laser applications or low power laser use is to produce the top layer directly in photoresist. Following development, many photoresist materials are nearly completely transparent over a broad spectral range, from as short as 200 nm to as long as 1400 nm. As a result, these, typically organic based, dielectrics serve quite nicely as the top layer in a multilayer dielectric grating. Again, the initial multilayer stack is produced by conventional techniques. An antireflective or absorbing layer may be placed on top of the multilayer before photoresist coating if necessary to minimize the reflectance of any radiation from the multilayer stack or mask layer during photoresist exposure. Photosensitive material (commonly positive or negative photoresist) is then coated at the appropriate thickness either directly on the multilayer dielectric stack or on top of the absorbing/antireflective layer. The photosensitive material is then exposed to the grating pattern. The pattern can be produced either via exposure through a mask or by interference (holographic) techniques. Following creation of the latent image, the photoresist is chemically developed to produce a surface relief grating. By controlling the thickness of photoresist, exposure level and development process, grooves of the appropriate depth are readily produced. After development, the completed grating can be baked or post-processed by other means to remove any residual solvents or unwanted chemical species. This process would correspond to stopping at step D of the lift-off process schematic shown in FIG. 8. Multilayer dielectric gratings have been produced by this method using several photoresists and have demonstrated a diffraction efficiency in reflection as high as 96.7% with a photoresist grating fabricated on top of a hafnium oxide/silicon oxide multilayer consisting of 8 pairs of near quarter-wave layers of alternating high index (n~2.0, $HfO_2$) and low index (n~1.5, $SiO_2$) material deposited on borosilicate glass.

Figure 8A:
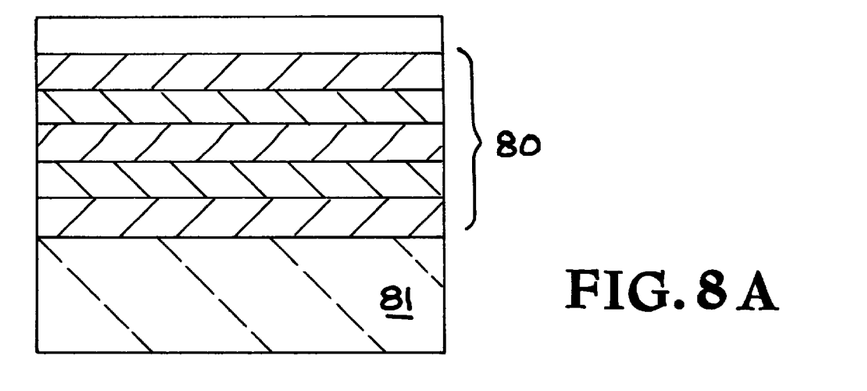
FIGS. 8A–F show the steps for fabricating a multilayer dielectric grating by using a "lift-off" process.
Figure 8B:
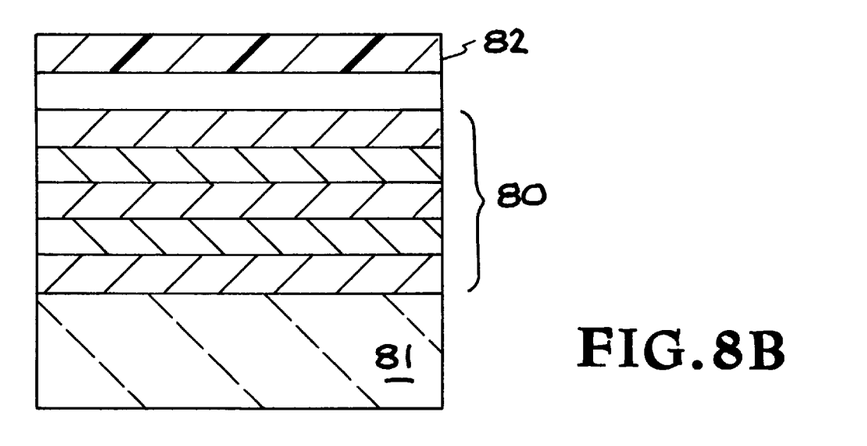
Figure 8C:
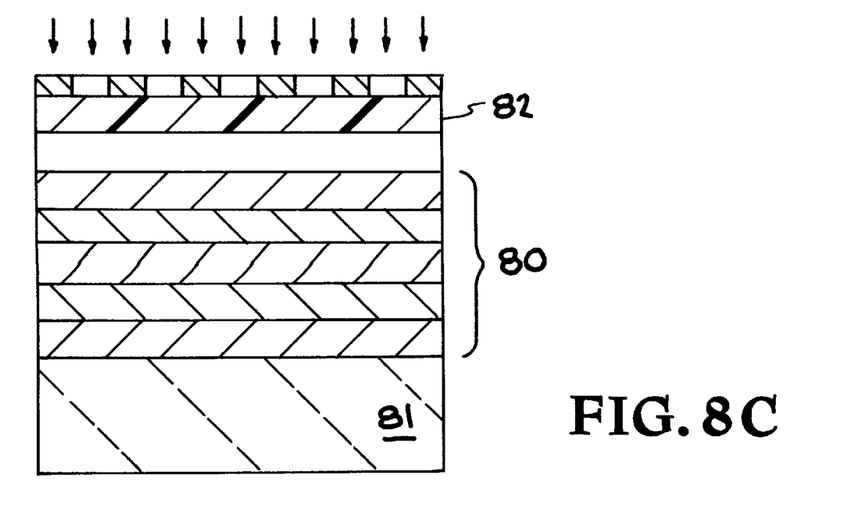
Figure 8D:
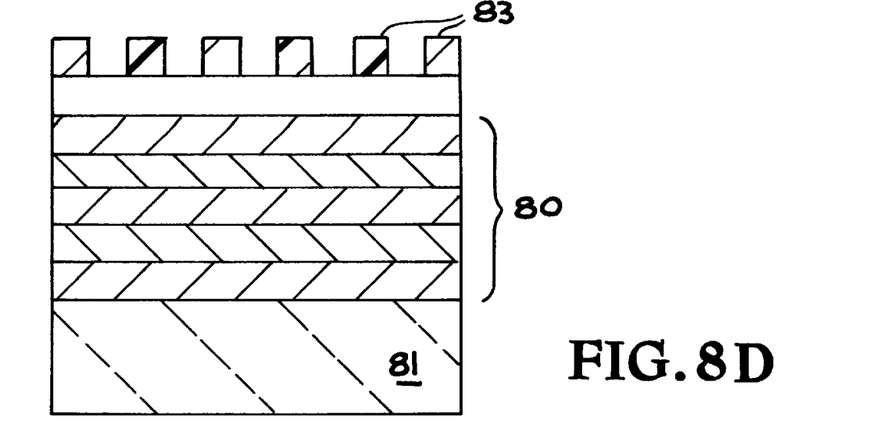

The "lift-off" technique is shown in FIGS. 8A–F. The initial multilayer dielectric stack 80 is produced by conventional means and affixed to substrate 81 (FIG. 8A). An antireflective or absorbing layer may be placed on top of the multilayer 80 before photoresist coating if necessary to minimize the reflectance of any radiation from the multilayer stack or mask layer during photoresist exposure. Photosensitive material (photoresist) 82 is then coated at the appropriate thickness either directly on the multilayer dielectric stack or on top of the absorbing/antireflective layer. The photosensitive material is then exposed to the grating pattern (FIG. 8C). The pattern can be produced either via exposure through a mask or by interference (holographic) techniques. Following creation of the latent image, the photoresist is chemically developed to produce a surface relief grating 83 (FIG. 8D). Depending upon the selection of photoresist, exposure and development technique, the surface relief pattern 83 in photoresist may need to be steepened. Specifically, the slope of the sidewalls of the photoresist can be increased to vertical or even undercut by several methods, including but not limited to:

1) Image reversal by amine treatment with predevelopment, post-exposure bake followed by blanket UV exposure and development;
2) Chlorobenzene soak step between exposure and development;
3) Directional deposition of a metal mask on both sides of the grating profile to make a metal cap on top of the resist;
4) Illumination of the substrate from the back side;
5) Use of a negative resist of sufficient resolution; and
6) Use of high contrast positive photoresist.

Figure 8E:
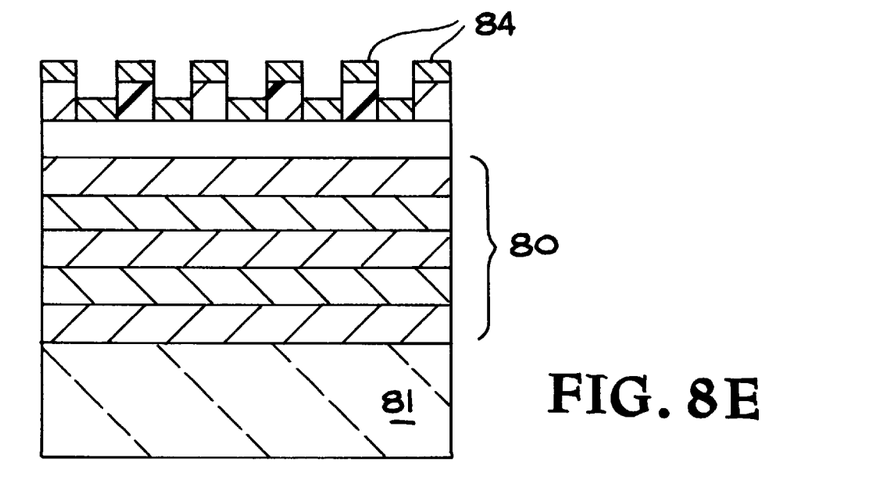
Figure 8F:
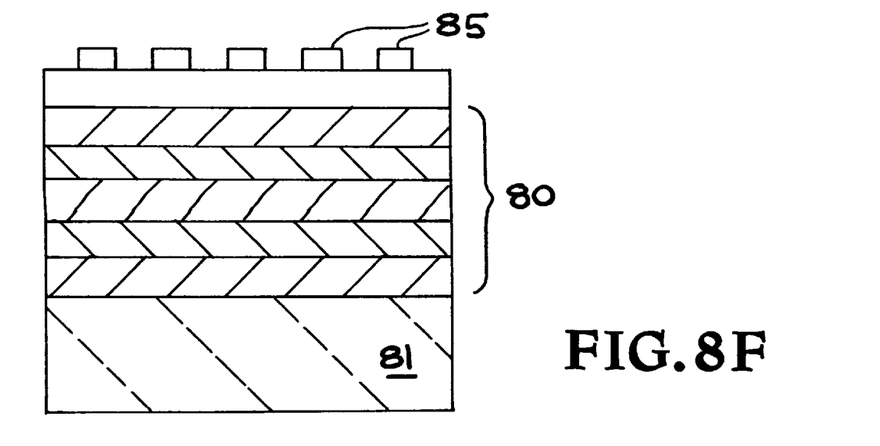

Once the appropriately shaped lift-off structure is formed (e.g., photoresist grating with near vertical sidewalls as shown in FIG. 8D, the dielectric grating material 84 is deposited on the substrate by unidirectional electron-beam evaporation (or other suitably unidirectional deposition technique) (FIG. 8E). In most cases, the equipment used for this deposition can be the same equipment used to deposit the original multilayer stack. The depth of the grating grooves will be determined by the thickness of dielectric material deposited. Following this deposition, the original photoresist grating mask 84 can be removed ("lifted-off") by chemical dissolution or plasma means. This removes the dielectric material on top of the photoresist resulting in a completed multilayer dielectric diffraction grating 85 (FIG. 8F). Depending upon the design requirements, the dielectric material comprising the grooves may or may not be identical to the top layer of the planar stack.

Figure 9A:
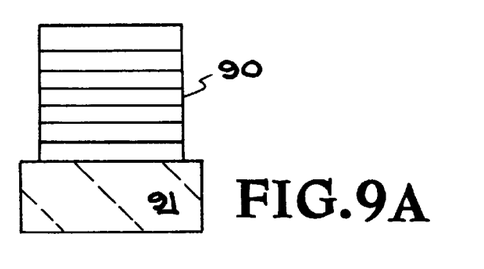
FIG. 9A–I show the steps for fabricating a multilayer dielectric grating with a chemical (wet) etch process.
Figure 9B:
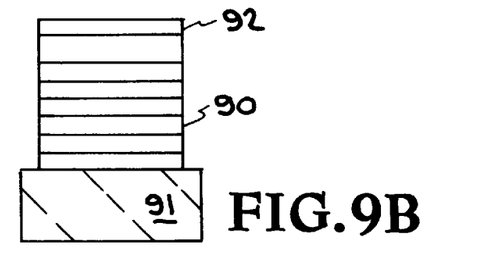
Figure 9C:
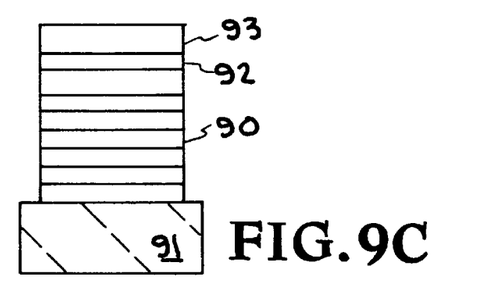
Figures 9D, 9E:
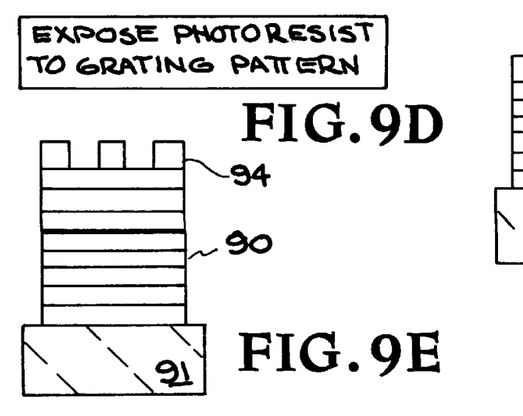
Figure 9F:
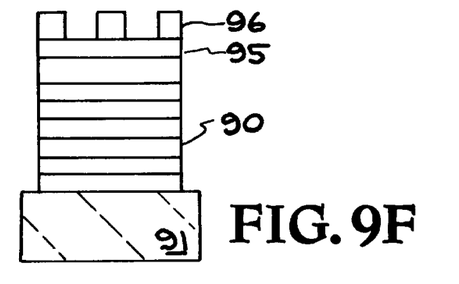
Figure 9G:
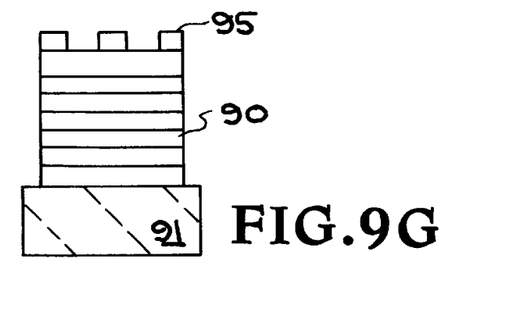
Figure 9H:
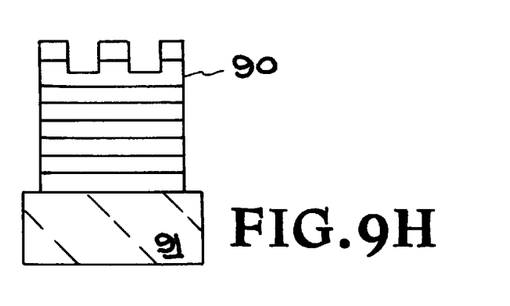
Figure 9I:
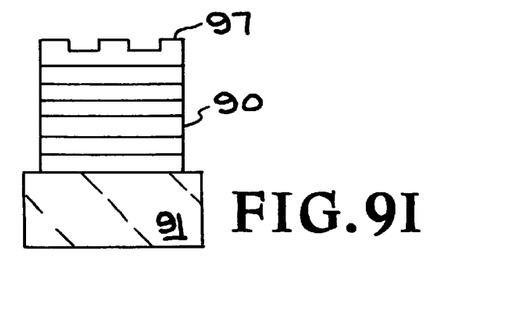

The use of a chemical (wet) etch process for fabrication of a grating of the present invention is shown in FIGS. 9A–L. A multilayer thin film dielectric coating 90 is affixed to a substrate 91 (FIG. 9A). An etch mask layer 92 is then coated onto the top layer of the multilayer dielectric coating 90 (FIG. 9B). Photosensitive material (photoresist) 93 is then coated onto the etch mask layer 92 (FIG. 9C). The photoresist 93 is exposed to a grating pattern (FIG. 9D), and upon development, results in a grating pattern 94 in the photoresist (9E). The unprotected etch mask 95 and photoresist 96 are removed by either chemical or plasma means (FIGS. 9F–9G). The top layer of dielectric multilayer 90 is etched with a chemical (wet) process (FIG. 9H). Once the dielectric layer is etched to the appropriate depth, the etch mask is removed to result in a competed multilayer dielectric grating 97 (FIG. 9I).

There are numerous commercial applications of this new class of diffraction grating. Commercial laser systems employing gratings for pulse compression will find immediate use in the increased diffraction efficiency and damage threshold. The increased damage threshold will permit a reduction in size and cost of grating pulse compressors not possible with current metallic gratings. In addition, the combination of high efficiency and resistance to laser damage will make possible the development of high power, tunable, narrow-linewidth, lasers based on broadband solid-state materials such as alexandrite, titanium-doped sapphire, chromium-doped LiSrAlF$_6$, neodymium-doped glass and other laser materials exhibiting high energy storage. Grating cavity configurations as employed previously in dye laser systems have not been possible with high power density lasers (e.g. solid-state) due to the inability of conventional metallic gratings to withstand the high power density. This new type of grating will also extend high efficiency diffracting structures far into the ultraviolet (to below 220 nm) where the reflectivity of metallic coatings drops precipitously.

Another unique feature of these gratings is the ability to arbitrarily adjust the bandwidth and angle of use of the grating. Since the efficiency of the grating is determined by the angle of incidence, the grating structure and the multilayer structure, the optical bandwidth and efficiency of the grating is adjustable. Some frequency components can be reflected, some transmitted, and others diffracted in either reflection, transmission, or both. This provides extreme selectivity not possible with conventional metallic or bulk dielectric transmission gratings. The optical selectivity makes it possible to select a narrow spectral region with the grating while discriminating against all others. This feature will find immediate use in high contrast spectrometers where discrimination of 10$^{-6}$ (1 part per million) is often required and is currently achieved by the use of multiple conventional gratings and/or interference filters. The spectral selectivity feature of these gratings will also find use as discrimination filters. Specifically, the gratings can be designed to reflect narrow line undesirable optical radiation (e.g., laser radiation) while transmitting most other frequencies. An example of such an application would be to form eyeware from a multilayer grating such that the grating would transmit visible radiation and reflect (with high efficiency) unwanted radiation present from laser weapons or laser guidance systems. Finally, since the distribution of energy between the specularly reflected, transmitted and diffracted beams is controllable by adjusting the design of the multilayer and grating structure, these devices can be used as selective beam splitters for use in optical switches, distribution and projection systems (e.g., head-up or flat-panel displays).

Changes and modifications in the specifically described embodiments can be carried out without departing from the scope of the invention, which is intended to be limited by the scope of the appended claims.

We claim:

1. A nonmetallic apparatus for producing specular reflection and diffracted orders in reflection and transmission, comprising:

a substrate comprising dielectric material;

a dielectric stack comprising a plurality of layers, wherein each layer of said plurality of layers comprises either a high refractive index dielectric material or a low refractive index dielectric material, wherein said high refractive index dielectric material and said low refractive index dielectric material comprise a difference in refractive index greater than 0.1, wherein said plurality of layers comprises a top layer and a bottom layer, wherein said bottom layer is affixed to said substrate, wherein each layer of said plurality of layers comprises a continuous film; and a nonmetallic diffraction grating comprising grooves, wherein each groove of said grooves comprises a depth and a shape, wherein said diffraction grating is formed within said top layer of said plurality of layers, wherein the fraction of light incident on the apparatus which undergoes specular reflection, diffraction and transmission is determined by adjusting (i) the number of layers of said plurality of layers, (ii) the thickness of at least one layer of said plurality of layers and (iii) said depth and shape of said grooves.

2. The apparatus of claim 1, wherein said dielectric stack comprises dielectric material transparent to a wavelength of interest.

3. The apparatus of claim 2, wherein said dielectric stack comprises alternating layers of oxide material.

4. The apparatus of claim 2, wherein said material is selected from a group consisting of HfO$_2$, SiO$_2$, Al$_2$O$_3$, Nb$_2$O$_3$, Ta$_2$O$_{4-5}$, Sc$_2$O$_3$, ZrO$_2$, and TiO$_2$.

5. The apparatus of claim 1, wherein said substrate comprises transparent material.

6. The apparatus of claim 1, wherein said substrate comprises opaque material.

7. The apparatus of claim 1, wherein said substrate comprises reflective material.

8. The apparatus of claim 1, wherein said substrate is flat.

9. The apparatus of claim 1, wherein said substrate comprises a curved surface, wherein said curved surface has been prepared prior to affixing said plurality of layers to said dielectric stack.

10. The apparatus of claim 1, wherein said dielectric stack comprises alternating layers of material transparent to a wavelength of interest, wherein said material is selected from a group consisting of oxide material, fluoride material, sulfide material and or selenide material.

11. The apparatus of claim 1, wherein said dielectric stack comprises alternating layers of oxide materials that are designed to serve as a coating of any reflectance for a wavelength of interest.

12. The apparatus of claim 1, wherein said substrate comprises dielectric material.

13. The apparatus of claim 12, wherein said substrate comprises dielectric material selected from a group consisting of glass, silica and sapphire.

14. The apparatus of claim 12, wherein said substrate comprises organic material.

15. The apparatus of claim 12, wherein said substrate comprises polymeric material.

16. The apparatus of claim 1, wherein said substrate comprises material selected from a group consisting of plastics, nylon and resin.

17. The apparatus of claim 1, wherein said substrate comprises semiconductor material.

18. The apparatus of claim 17, wherein said substrate comprises semiconductor material selected from a group consisting of silicon and gallium arsenide.

19. A method for fabricating a nonmetallic diffraction grating for producing specular reflection and diffracted orders in reflection and transmission, comprising:

placing a multilayer dielectric stack upon a substrate;

placing an antireflective or absorbing layer upon the top of said multilayer stack, wherein said layer minimizes the reflectance of light from said multilayer dielectric stack during the step of exposing photosensitive material, wherein said antireflective or absorbing layer comprises a material which is transparent to the wavelength of light at which the grating will eventually be used;

coating photosensitive (commonly positive or negative photoresist) material on said absorbing layer;

exposing said photosensitive layer to a periodic pattern of light and dark radiation (the grating pattern);

developing said photosensitive material to produce a surface relief pattern;

depositing a plurality of layers of dielectric material upon said surface relief pattern, wherein each layer of said plurality of layers comprise a precise thickness as determined by the required functionality of said nonmetallic diffraction grating, wherein each layer of said plurality of layers comprises either a high refractive index dielectric material or a low refractive index dielectric material, wherein said high refractive index dielectric material and said low refractive index dielectric material comprise a difference in refractive index greater than 0.1, wherein said plurality of layers comprises a top layer and a bottom layer, wherein said bottom layer is affixed to said substrate; and removing (lift-off) any remaining photosensitive material to produce a completed multilayer dielectric diffraction grating comprising grooves, wherein each groove of said grooves comprises a depth and a shape, wherein said diffraction grating is formed within said top layer of said plurality of layers, wherein the fraction of light incident on the apparatus which undergoes specular reflection, diffraction and transmission is determined by adjusting (i) the number of layers of said plurality of layers, (ii) the thickness of at least one layer of said plurality of layers and (iii) said depth and shape of said grooves wherein each layer of said multilayer dielectric diffraction grating comprises a continuous film, wherein said multilayer dielectric diffraction grating comprises a top layer comprising a diffraction grating.

* * * * *